United States Patent [19]

Rotem et al.

[11] Patent Number: 4,797,615
[45] Date of Patent: Jan. 10, 1989

[54] DETERMINING AND CORRECTING FOR PHASE JUMPS

[75] Inventors: Haim Rotem, Moshav Rishpon; Yair Shimoni, Jerusalem; Shmuel Goldberg, Tel Tsur, all of Israel

[73] Assignee: Elscint Ltd., Haifa, Israel

[21] Appl. No.: 103,012

[22] Filed: Sep. 30, 1987

[51] Int. Cl.⁴ ............................................. G01R 33/20
[52] U.S. Cl. ...................................... 324/309; 324/307
[58] Field of Search ......................... 364/413; 128/653; 324/300, 307, 309, 312

[56] References Cited

U.S. PATENT DOCUMENTS

| | | | |
|---|---|---|---|
| 4,574,240 | 3/1986 | Libove | 324/309 |
| 4,609,872 | 9/1986 | O'Donnell | 324/309 |
| 4,651,095 | 3/1987 | Eastwood | 324/307 |
| 4,661,775 | 4/1987 | Kormos | 324/307 |
| 4,665,366 | 5/1987 | Macovski | 324/307 |
| 4,684,891 | 8/1987 | Feinberg | 324/309 |
| 4,698,591 | 10/1987 | Glover | 324/307 |
| 4,720,679 | 1/1988 | Patrick et al. | 324/309 |

Primary Examiner—Michael J. Tokar
Attorney, Agent, or Firm—Sandler & Greenblum

[57] ABSTRACT

A continuous phase magnetic field map is provided by dividing the field map of elements into regions; determining discontinuities in the regions and adding a constant modulo $2\pi$ to the phase values of each element of the region which results in a minimum difference between adjacent elements of the region. Then similarly joining the continuous regions to form continuous sections and the continuous sections to form continuous zones until substantially continuous phase magnetic field maps are obtained.

16 Claims, 10 Drawing Sheets

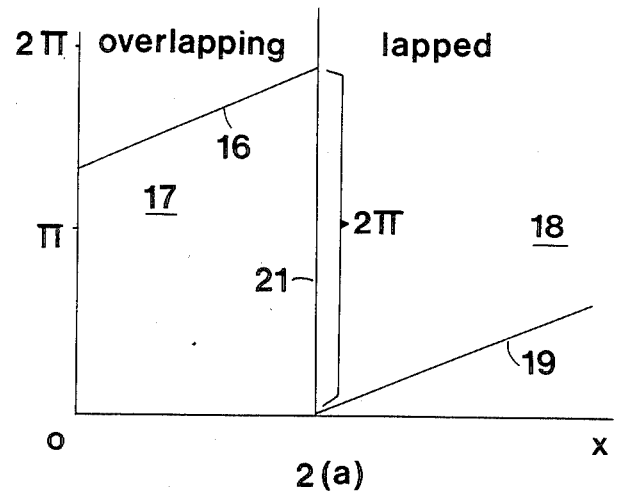
2(a)
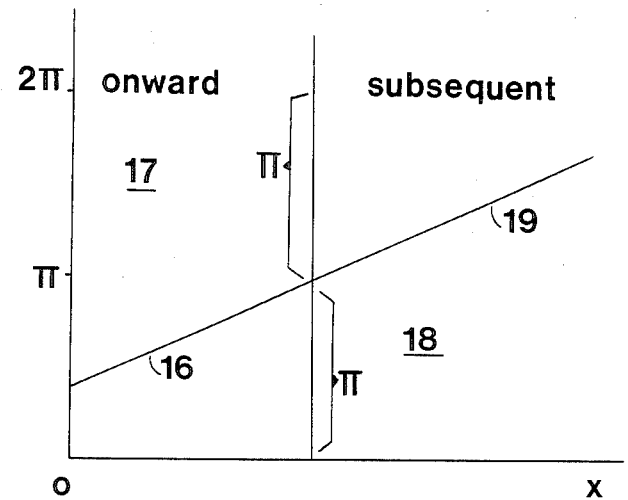
2(b)
fig. 2

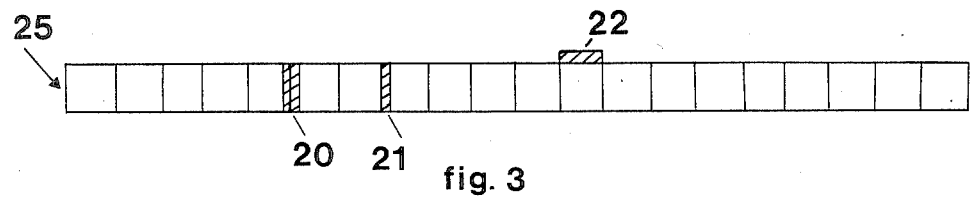
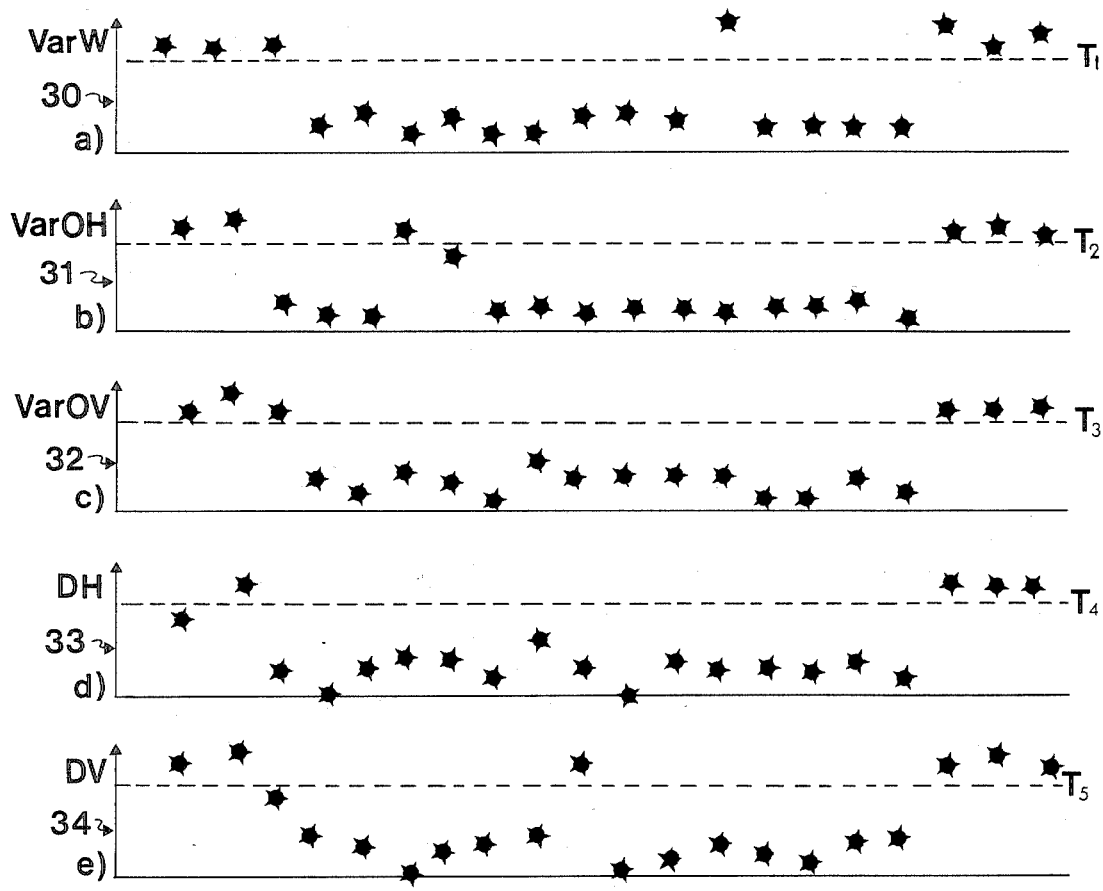
fig. 4

DETERMINING AND CORRECTING FOR PHASE JUMPS

FIELD OF THE INVENTION

This invention is concerned with arrangements for determining and correcting for phase jumps and more particularly, to such arrangements used in conjunction with mapping the static magnetic fields of magnetic resonance (MR) systems. Field mapping is required, for example, when performing shimming or in vivo localized spectroscopy and/or chemical shift imaging.

BACKGROUND OF THE INVENTION

Many MR processes such as imaging (MRI) and spectroscopy (MRS) require homogeneous static fields. It is customary with MR equipment to map the static field to determine the distribution of the inhomogeneity and to attempt to correct this inhomogeneity with shim coils. When mapping the static field it is often necessary to determine and correct for phase jumps.

There are different methods presently used for mapping the static field distribution. Among the prior art methods for measuring the static field distribution is a method disclosed by Maudsley et al in a article entitled "Field Inhomogeneity Correction and Data Processing for Spectroscopic Imaging" published in the Magnetic Resonance Medical Journal, 1985, vol. 2, pp. 218–233. See also the article by Maudsley et al. entitled "Magnetic Field Measurement by NMR Imaging" which appeared in the J. Phys. E:Sci. Instrum., vol. 17, pp. 216–220. Another method for measuring the static field distribution in magnetic resonance systems is described in an article entitled "A New Method of Measuring Static Field Distribution Using Modified Fourier NMR Imaging" by K. Sekihara et al., published in the J. Phys. E:Sci. Instrum., vol. 18, 1985.

The methods for measuring the static field distribution described in the articles used phantoms and not actual subjects within the bore of the magnet. It is well known that placing a subject (patient) in the bore of the magnet drastically alters the magnetic field distribution. See, for example, an article entitled "Separation of True Fat and Water Images by Correcting Magnetic Field Inhomogeneity in Situ" by H. N. Yeung, et al. which appeared in the Journal of Radiology, 1986, vol. 159, pp. 783–786. It is becoming more standard to measure the static magnetic field inhomogeneity in situ, that is, with the subject positioned within the bore. The measurement and correction of the magnetic field inhomogeneity with a patient in the bore (in situ) is especially required for in vivo localized spectroscopy and for chemical shift imaging where highly homogeneous magnetic fields within the region of interest are not only desired but are required.

As explained in the last cited article the magnetic field inhomogeneity is mapped using standard imaging sequences with minor adjustments for the mapping. For example, a two-pulse and two-echo sequence is used with variations in the time between the 90 and the 180 degree pulses and with the echo time being varied to emphasize and measure the field inhomogeneity. Thus, in general, the inhomogeneity is derived by determining a phase map of a portion image of the human body in situ. In this determination the natural 3.5 parts per million (ppm) chemical shift between water and fat molecules is cancelled by assuring that the phase differences between the water and fat signals are equal to $2\pi$ or integer multiples of $2\pi$. In other words pulse sequences used for measuring the phase angles are adjusted so that the 3.5 ppm shift corresponds to an integer number of cycles. To make the adjustment it is necessary to measure the local inhomogeneity induced by the body part being scanned; since, as is well known this local inhomogeneity often causes a phase shift greater than the 3.5 ppm chemical shift between the water and the fat molecules.

Another and unique method for obtaining magnetic field inhomogeneity maps in situ is taught in a patent application filed in Israel on Nov. 30, 1986 and receiving Ser. No. 80814 (assigned to the assignee of this invention).

An ubiquitous problem present with phase mapping of MR system is known as "phase wrapping". Phase wrapping occurs when the phase angle is greater than $2\pi$ (or less than 0) radians. The measuring system only measure angles between 0° and 360° ($2\pi$ radians) and angles over 360° are registered as the difference between the actual angle and 360 degrees. However, the inhomogeneity of the static field often exceeds $2\pi$ radians.

In other words the measurement of the field inhomogeneity results in phase jumps when there are phase angles that are greater than $2\pi$. Since the systems only measure angles between zero and $2\pi$ a resultant phase angle between zero and $2\pi$ may actually be "wrapped around;" i.e., be an angle greater than $2\pi$. Determining if a measured angle is in the range of zero to $2\pi$, or is greater than $2\pi$, or $4\pi$, or greater than $2N\pi$ is herein called "phase unwrapping".

Algebraic manipulations of the phase map require continuity in the region of the signal; therefore, it is necessary to perform phase unwrapping in order, among other things, to correct for the field inhomogeneities when doing in vivo localized spectroscopy and/or chemical shift imaging.

Accordingly, scientists and especially scientists in the MR field have been seeking arrangements to provide phase data that does not suffer from phase wrapping. For example, MR scientists desire continuous maps (free of phase wrapping) of the magnetic field distribution. To date there is no known satisfactory arrangement for the determination and correction for phase jumps. Known attempts to correct for phase wrapping take too long and accordingly, cannot be performed while the patient remains substantially motionless in the bore of the magnet.

BRIEF DESCRIPTION OF THE INVENTION

Accordingly, it is an object of the present invention to provide a method for unwrapping phase angles, said method comprising the steps of:

acquiring a phase image comprising a plurality of pixels arranged in columns and rows, dividing the phase image into contiguous groups (or a mesh) of regions each comprising a plurality of pixels wherein the sizes of the regions are sufficiently small to limit the phase spread in all or almost all of the regions to being less than $2\pi$ radians, phase unwrapping in each region to thereby provide a continuous phase map in each region, and phase unwrapping along the region border lines to provide a continuous phase map over the completed phase image.

In accordance with a feature of the present invention the step of phase unwrapping in each region comprises:

adding an appropriate phase-constant to all pixels per region, determining the phase modulo $2\pi$ for each pixel; and subtracting the phase constant for each region from all pixels in each region.

A phase modulo $2\pi$ is herein defined as the amount in radians that the phase is greater than $2\pi$ radians or integer multiples of $2\pi$ radians where the phase modulo $2\pi$ is limited to be between 0 and $2\pi$ radians.

According to a related feature of the present invention the phase constant to be added and subsequently subtracted is determined by finding the phase constant that results in the minimum standard deviation of the phase distribution in each region.

According to yet another feature of the present invention the phase constant is obtained by determining the phase constant which minimizes the sum of maximal absolute phase differences between each pixel and its contiguous neighbors on one side of the pixel.

A related feature of the invention comprises using the method for determining and correcting for phase wrapping or phase jumps to obtain magnetic field inhomogeneity maps without any phase wraparounds.

In another feature of the invention the step of phase unwrapping along the region borders comprises removing the discontinuities (phase jumps or wrap arounds) by adding the necessary multiples of $2\pi$ radians to the values at each side of region boundaries to thereby produce a phase map which is continuous in all connected regions even in the presence of noise.

Yet a further feature of the present invention comprises removing the discontinuities along the region boundary lines by overlapping the subregions by an area of at least one pixel along the abutting line between regions.

BRIEF DESCRIPTION OF THE DRAWINGS

The above named and other features and objects of the present invention will be best understood when considered in the light of the following description of a broad aspect of the present invention made with reference to the accompanying drawings; wherein:

FIGS. 2(a) and 2(b) graphically show a phase jump and a corrected phase jump respectively, FIG. 3 shows a string of regions including overlap subregions, FIGS. 4(a)–4(e) are graphical showings of the variations in the regions.

GENERAL DESCRIPTION

Figure 1:
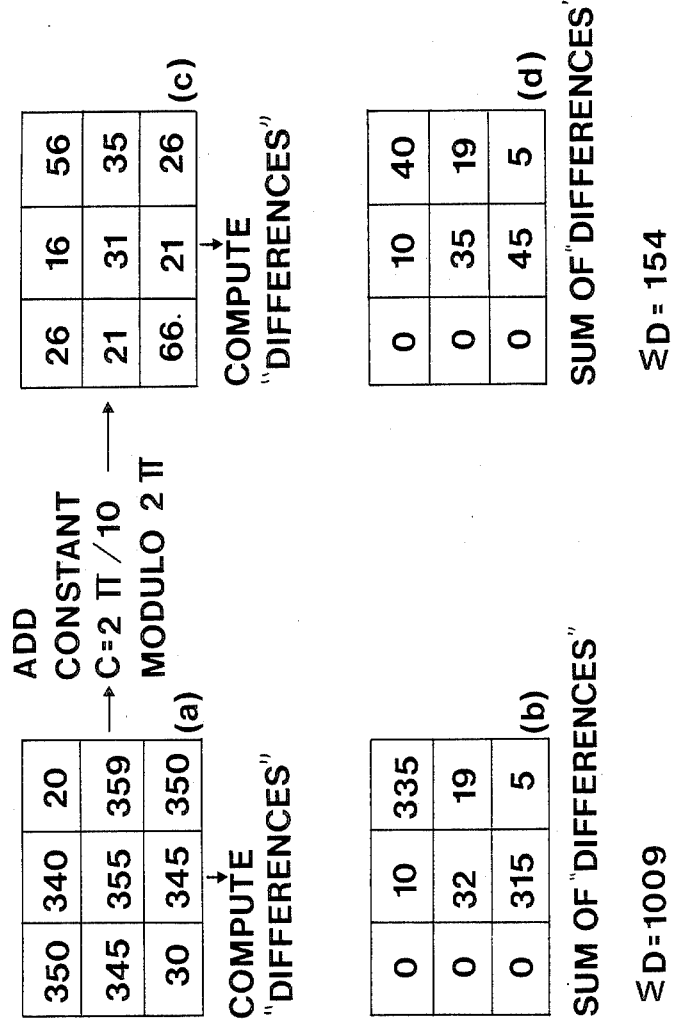
FIG. 1 shows three steps in the unwrapping process of the present invention.

The scope of this invention is not limited to the method used for acquiring a phase map. Therefore, it is assumed that there is a phase map or image and that the method of acquiring the phase map is immaterial. In the example described herein the phase map requiring phase unwrapping is an inhomogeneity map or image of an MR system. The inhomogeneity map is preferably derived by a linear combination of two phase maps which can be obtained either in a single scan or in a plurality of different scans. What does matter is that the inhomogeneity maps are derived from actual phase images and that the phase angle measuring equipment can only determine angles that are in a range of from 0 to 360 degrees. Since the data really varies over a much wider range than $2\pi$ radians (or 360°), at preset values of the phase angles the system reverts from the end of the cycle to the beginning of the cycle. That is, when the phase angle passes 360° it reverts to the 0° point instead of going into angles that are greater than 360°. The system also reverts from the beginning of the cycle, i.e. 0° to the end of the cylce of $2\pi$, i.e. 360° instead of going into minus phase angle readings. Continuous phase maps i.e. without phase jumps are needed for such things as automatic shimming, water lipid separation and localized spectroscopy. These purposes listed are not to be construed as limitations on the scope of the invention but merely as examples of when phase unwrapping is required.

To make the phase map continuous i.e. without any phase jumps, the map is broken up into a plurality of regions. First each of the regions is made continuous internally and then all of the regions are made continuous with their neighbouring regions to form a fully continuous phase map.

In accordance with the first step, the phase map is divided into regions, each comprised of a plurality of pixels. The phase value of each of the pixels is manipulated to assure that there are no phase jumps between contiguous pixels. The problem of accomplishing the region's inner continuity is at least partially solved by selecting the size of the regions to preclude phase jumps. Thus, a first criteria is that the regions be made small enough so that when the entire phase map is made continuous the data inside the regions will not vary over a range larger than $2\pi$. A region size is selected and the region is subsequently checked to determine if the region includes phase changes larger than $2\pi$ between the pixels in the region with the maximum and the minimum phase value. If there are phase changes over the whole region larger than $2\pi$, after correcting for phase jumps then the region is divided into smaller regions.

The lower limit on the size of the regions (sometimes also referred to herein as "subimages") is set by such things as:

1. the validity of a criteria selected and used to determine that a phase jump has occurred,
2. the response of the criteria to noise, and
3. the amount of work needed for subsequently connecting the subimages.

The last limitation includes considerations such as that the subimages overlap at their boundaries. Accordingly, the size and shape of the subimages should allow for the overlap. Thus, it is preferable for rectangular images to use rectangular subimages and it is also preferable to have an integer number of subimages cover the whole image including the overlap. Further, it is preferable to have the subimages easily divided into sets of sub subimages (subregions) if this becomes necessary. Therefore, a preferred embodiment comprises square regions each with a side of 17 (16+1 for overlap) for head images and square regions each with a side of 9 (8+1 for overlap) for body images. These regions can be divided into square subimages of side 9 or 5 respectively. However, other sized regions, subregions and sub subregions can be used within the scope of this invention.

A wrap around determining criteria is used. The criteria for determining wrap around is chosen to have the following properties;
(1) sensitivity to phase jumps in order to be able to detect phase jumps;
(2) relative insensitivity to noise so as not to generate errors i.e. by phase unwrapping where there are no phase jumps, and
(3) sensitivity to the size of the phase jump.

In a preferred embodiment a variation-like criterion is used per region or subregion. In one-dimensional functions, the variation is defined as the sum (or integral) of the absolute value of the differences between a pixel's phase value and the preceding pixel's phase value for each of the contigious pixels in a region, for example. That is:

$$C = \Sigma | V(p) - V(p-1) |;$$

where
C = criteria,
V(p) = pixel phase value, and
V(p−1) = preceding pixel's phase value.

The criterion yields the sum of the absolute differences between contigious pixel values using the pixels in the areas being investigated for phase jumps.

The above criterion is sensitive to phase jumps which are characterized by a near $2\pi$ difference between neighboring pixel values compared to relatively small differences where there is no phase jump between neighboring pixels. When the criterion indicates a phase jump, a value is added (modulo $2\pi$) that causes the data to be continuous; i.e. the phase jump disappears as the relatively small variation indicates, When a value is added (modulu $2\pi$) such that the phase jump appears the variation increases by a multiple of $2\pi$, approximately. Thus, a no-phase-jump situation is indicated when the value added results in a minimum variation.

The criterion used in the preferred embodiment for two dimensional phase maps is similar. That criterion is herein called "variation".

The "variation" used in the preferred embodiment is a sum of absolute "differences". It should be noted, however, that the variance or standard deviation of the same "differences" can also serve as criteria as should other statistic characteristics of the "differences"; but, the sum of absolutes is the simplest to calculate. Also, the variance or standard deviation do not always have a minimum when the data is continuous but rather on given data structures they have a minimum when a phase jump is present. In addition, a measure that gives too much weight to the large "jumps" is not wanted as such a measure would fail to indicate phase wrap-arounds when the region contains large noisy portions. Although the sum of absolutes is preferred, the invention covers all criteria based on the "differences".

The "difference" is defined herein as the maximum difference between a pixel phase value and the phase value of its contiguous neighbors. The definition in a preferred embodiment is refined to be the maximum absolute difference between a pixel and the 3 contiguous neighbors which precede the current pixel from the pixel scan direction i.e. the three contiguous neighbors in the preceding column of the same region.

Other definitions are possible and will work. These include but are not limited to the gradient vectors' amplitude; the sum of square differences along 2 orthogonal directions (say, $dx^2 + dy^2$, where dx stands for the difference along the X axis and dy is the difference along the Y axis); the sum of absolute differences in a number of directions (2–8); use of prediction errors with more complex predictors instead of use of the differences (differences are 0-order predictor errors). Thus, it should be understood that although the use of the 3 neighbors maximum absolute differences is described herein, the invention covers other "difference" definitions too.

Means are provided for overcoming the problems noise causes in determining the existence of phase jumps. Noise is randomly spread over the whole possible range of values. Thus, usually while one noisy pixel among the others may reduce the number of phase jumps, another noisy pixel will increase the number of jumps. The "variation" of a noisy region is nearly constant (this is true for large enough regions) and the "variation" of a region with both noise and real data will still be a minimum when there is no phase jump in the data. This minimum, however, is harder to find since the "variation" also becomes more noisy. The larger the fraction of the region which is covered by noise, the noisier is the "variation". For large enough noisy portions this noise prevents finding the true minimum. Fortunately, this condition is easily detected: as the size of the noisy portion increases, so does the value of the "variation". If noise covers the whole region that the total "variation" is large.

The "variation" is also larger than normal when the data varies inside the subimage over more than $2\pi$ radians. In this case, there is a minimum; but, the minimum is much larger indicating that there is still a phase jump over part of the subimage.

A phase jump located inside the subimage after the normal corrective steps i.e. the addition of a constant modulo $2\pi$ is easily corrected by reducing the size of the subimage again. The smaller sub subimage will include only smaller ranges of values and thus be easier to make internally continuous. The division into sub subimages should help also in cases of a large noisy area, since in most cases it will separate the noisy area from the data area. When even the smaller sub subimages contain too much noise it is just as well to leave that sub subimage as is. If, however, one or more of the sub subimages does include enough data then such sub subimages are made continuous to each other and/or to subimages.

FIG. 1 is an example of the use of the "variations" and the sum of the differences to obtain a continuous regional phase map (the numbers are in degrees).

FIG. 1(a) represents a regional (or subregional etc.) phase map. The first step is to determine discontinuities. While it is easy for a person looking at the phaes map of FIG. 1(a) to determine that there are indeed discontinuities in the map, the computer has to follow certain prescribed steps before it can make such a determination. The first step is computing the "differences" which are shown in FIG. 1(b). The preferred mode of computing the "differences" is to find the maximum difference between each pixel and the three contiguous pixel in the column to the left of the pixel. Note that since there are no pixels in the region to the left of the left side border pixels, a "difference" value of zero is assigned to each of the left side border pixels.

The three differences for the pixel having the value 340 are 0 (no pixel in the region on the upper left side), 10 and 5; therefore 10 is the maximum. All of the absolute "differences" are summed giving a value of 1009. Such a high value indicates that there are phase jumps within the region. Thus, a threshold value of 500, for example, can be used to determine phase jumps.

However, at this point the computer does not know if the high value is due to noise or to phase jumps. The next step is to add a constant, modulo $2\pi$. In a preferred embodiment the constants added are $2\pi/10$ increments. The result of the addition of $2\pi/10$ modulo $2\pi$ to the pixel values of FIG. 1(a) is shown in FIG. 1(c).

For example, $350+36=386-360=26$.

This type of modulo addition is done to each of the pixels. The differences are then computed as previously explained with the results shown in FIG. 2(d). The sum of the absolute "differences" is a palatable 154, a relatively low value, indicating that the discontinuity has been removed. The computer, however, goes to the next step—not shown; i.e. adding $2\pi/10$ modulo $2\pi$ again, to the values of 2(c) determining the "differences", and the sum of the "differences" until the cycle is complete (after 10 such steps in this example). The step which yielded the smallest absolute difference value is selected as the one indicating the minimum. The continued steps assure that the smallest sum of the absolute differences is actually a minimum.

In summation to make the regions continuous the following steps are performed:
  (i) Computing phase "differences" for the pixels of the region;
    a. subtracting the phase value of each pixel from the phase value of the three contigious pixels in the column to the left of the pixel;
      1. assigning the value zero as the phase value difference of a pixel's phase value subtracted from the phase value of a pixel that is not in the region;
    b. using the maximum absolute difference from among the values obtained as the "difference" value;
  (ii) Summing the absolute "differences" over the whole region;
  (iii) Adding a $2\pi/n$ constant phase value modulo $2\pi$ to each pixel phase value in the region to obtain new pixel phase values;
  (iv) Computing the absolute "differences" from the new pixel phase values;
  (v) Summing the absolute "differences" of the new pixel phase values to obtain a new sum;
  (vi) Comparing the new sum to the old sum;
  (vii) Repeating steps (iii)-(vi) until a full $2\pi$ cycle is covered and selecting that addend which yielded the minimum sum; and
  (viii) Using the phase values of the region which yield the minimum absolute sum as the phase values used for connection to the other regions.

Connecting the Subimages to Form a Continuous Map

The continuous connection of two adjacent subimages forms a continuous section and is quite straightforward for subimages which fulfill a basic condition; i.e. inside the subimage the data is continuous. The subimages have an overlapping region, as mentioned before, and it suffices for one pixel in the overlap region to have the same phase value in both subimages for the two subimages to form a continuous region. The operation to cause the overlapping pixel and the lapped pixel to have the same phase value is done by changing the dc level of both the lapping and lapped pixels sufficiently until the two phase values coincide. This can be done by adding the difference between the two values to the side subtracted, or changing both sides by one half the difference between their values. This in effect is using normal addition or subtraction (not modulo $2\pi$).

FIG. 2 illustrates how the overlapping pixels are made continuous (albeit, a one dimensional illustration) to effect the continuous connection of adjacent regions. FIG. 2(a) graphically shows the pixel phase values 16 in a region (row) 17 having a pixel overlapping a lapped pixel in a region (row) 18 having values 19. The values of the overlapping and the lapped pixels are indicated along line 21 to be $2\pi$ and 0, respectively. The d.c. levels of both the overlapping pixel and the lapped pixel are changed by one-half the difference ($2\pi$) between the overlapping and the lapped pixel (or $\pi$) as shown in FIG. 2b. It should be understood that to change a border pixel value all of the pixels in the region are changed an equal amount as indicated in FIG. 2.

In the preferred embodiment the regions are scanned in a raster-like fashion. It is therefore, preferred to change only the current region being processed and match its border to the previously processed regions, leaving those previously processed regions unchanged. This ensures that once two regions are made continuous they are not later made discontinuous.

There are problems when the basic condition (i.e. continuous subimages) is not met in either or both of the subimages. This happens when the range of data in a subimage is more than $2\pi$ radians (when there can be no continuous solution within a single cylcle). Then, the subimages is further divided into sub subimages in which the basic condition can be met. The basic condition may also not be met when one or both regions have large noisy regions, or when the overlap region contains noise.

If there are pixels in the overlap region which should belong to two different cycles then the simple connection method will not work. A connection method to be described solves two common possibilities:
  (1) disconnected data regions (with noise in between), and
  (2) error induced regions with different dc levels due to errors.

It should be noted that when the pixel values in the lapped and overlapping regions are made equal, the only errors possible are errors in the dc level of exact multiples of $2\pi$.

The method used herein for eliminating phase wrap around in overlapping regions that include pixels belonging to different cycles (phase jumps from pixel to pixel) comprises the following three steps:
  a. connecting regions along 1 dimension, i.e. horizontal to form a plurality of continuous sections along that dimension, the plurality of continuous sections having different horizontal or vertical dimensions,
  b. connecting each section in a 2nd dimension, i.e. vertical, to a previously determined continuous area during a first passage over the entire image; and
  c. doing a second passage over the entire image in the opposite direction to the first passage.

This connection method creates continuous sections which are several subimages in size. The continuous sections keep growing in the 2nd dimension. The second passage step connects the areas into a complete continuous image.

FIG. 3 describes a horizontal string or row 25 of subimages and shows the overlap regions as shaded. Overlap regions 20 and 21 are examples of overlaps between neighboring subimages in the string. Overlap region 20 is an example of a symmetric overlap covering 2 pixels on both sides of the inter subimage border, while region 21 is an example of an overlap covering one pixel on the intersubimage border only. Overlap region 22 is an example of an overlap between a subimage in the current "row" and a subimage in the preceding string.

Connection Along One Dimension

This is preferrably done by a statistic majority rule as follows:
- a pixel in the overlap region between two subimages is selected;
- this pixel's phase values in both overlapping and lapped subimages are made equal as illustrated in FIG. 2; and
- the same value used to make the overlapping and the lapped pixel values equal is added to all the pixels of the regions of the selected pixels.

The values of all of the other pixels in each of the overlapping areas should then all be equal, up to a $2\pi$ phase jump and the two adjacent regions are continuous.

However, if even one of the subimages still contains a phase jump, whether noise or range induced, and this phase jump is in the overlap region then some of the overlapping pixels do not match. This mismatch means that some pixels may be in one cycle in one subimage and in a different cycle in the other subimage. The value difference will be an exact multiple of $2\pi$. Averaging the inter subimage differences over all the pixels in the overlap indicates the correct cycle to use: If the value exceeds $\pi$ then $2\pi$ must be added to the lower valued subimage (or subtracted from the higher one).

The majority rule is used for determining the correct phase value for all of the subimages comprising a string.

Division of the Data Along the One Dimension into Sections

The sections of obviously continuous data should be changed together, if possible, and continuous data sections should be as large as possible. However, care must be taken is designating the limits of such continuous sections in order to prevent errors caused by the connection of the continuous section to a subimage that is not continuous. Section terminators are used to prevent such errors. Section terminators are defined as any subimage where at least any one of the following tests are met:
1. The average "variation" in the subimage (hereinafer called VarW) is above a first threshold T1. VarW and T1 are graphically shown for the example 25 subimages of FIG. 3 at 30 in FIG. 4(a);
2. The average "variation" in the overlap region between the subimage and its predecessor along the first dimension (hereinafter called VarOH) is above a second threshold T2. VarOH and T2 are graphically shown at 31 of FIG. 4(b);
3. The average "variation" in the overlap region between the subimage and its predecessor along the second dimension (hereinafter called VarOV) is above a third threshold T3 (which might equal the second threshold). VarOV and T3 are graphically shown at 32 of FIG. 4(c):
4. The average absolute difference DH in the overlap region, between the pixel phase values in the current subimage and the pixel phase values in the overlapping pixels in the preceding subimage along the first dimension, is above a fourth threshold T4. DH and T4 are graphically shown at 33 of FIG. 4(d); or
5. The average absolute difference DV in the overlap region, between the pixel phase values in the current subimage and the pixel phase values of the overlapping pixels in the neighboring subimage along the second dimension is above a fifth threshold T5. DV and T5 are graphically shown at 34 of FIG. 4(e).

The thresholds are chosen fo eliminate noise. Accordingly, the thresholds are higher than approximately eighty per cent of the distance between the highest and the lowest values. This is apparent from FIG. 4.

Tests 2 and 4 and/or 3 and 5 may be combined so that a combination of, say, VarOV and DV is compared to a single combined threshold.

A section that includes a terminator forms a new section (maybe only 1 subimage long). A subimage which is not a terminator is appended to the preceding section. A section is from then on treated as a unit, and is made continuous to the portion of the image which is adjacent to it in the 2nd dimension and which is assumed to be already continuous.

Figure 5:
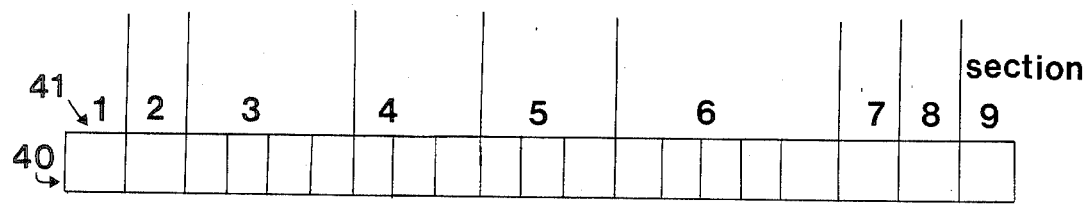
FIG. 5 is a showing of a string of regions of FIG. 3 divided into sections.

FIG. 5 indicates at 40 the same subimages 25 of FIG. 1 along a string as they are divided into nine sections 41. The first three subimages in the string are terminators. They apparently are all in a noisy area surrounding the object and are included in separate sections by most of the five tests as shown in FIG. 4. The following three subimages pass all five tests and are therefore appended to the third section. The seventh subimage starts a fourth section since its VarOH is over the threshold T2. The tenth subimage starts a fifth section since its DV is over the threshold T5 and the thirteenth subimage starts a sixth section since its VarW is over the threshold T1. The last subimages in the string are again apparently in the noisy area surrounding the object and are included in separate sections by most of the five tests above.

Connection of a Section in 2nd Dimension to Continuous Area

Figure 6A:
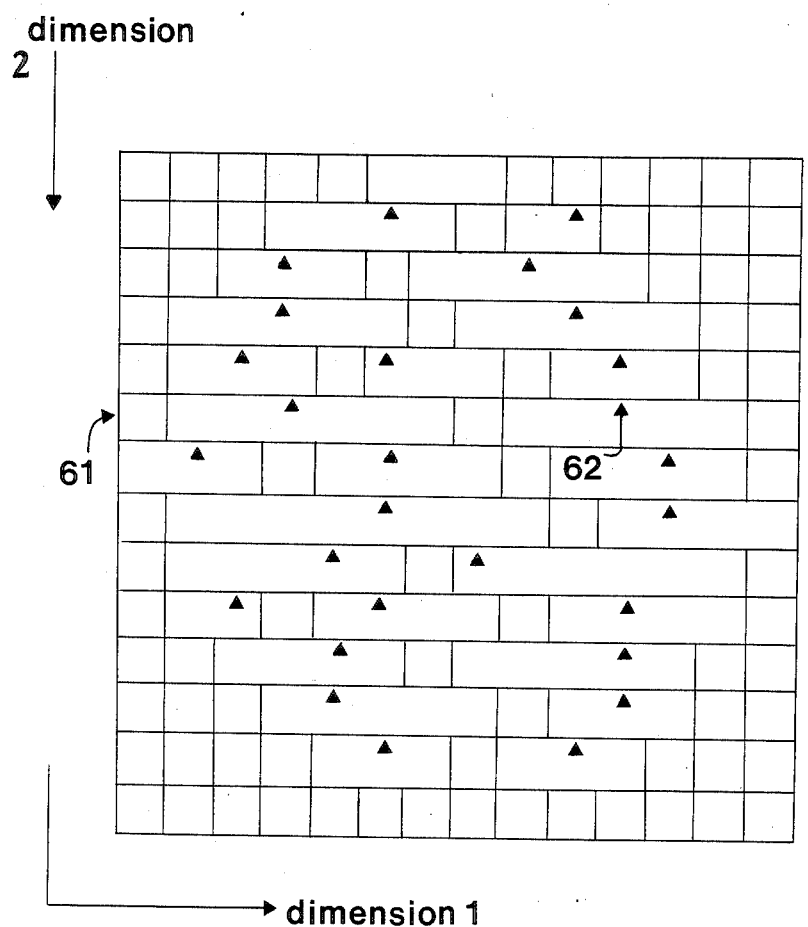
FIGS. 6(a)–(c) illustrate the connection of sections and zones in a first direction.
Figure 6B:
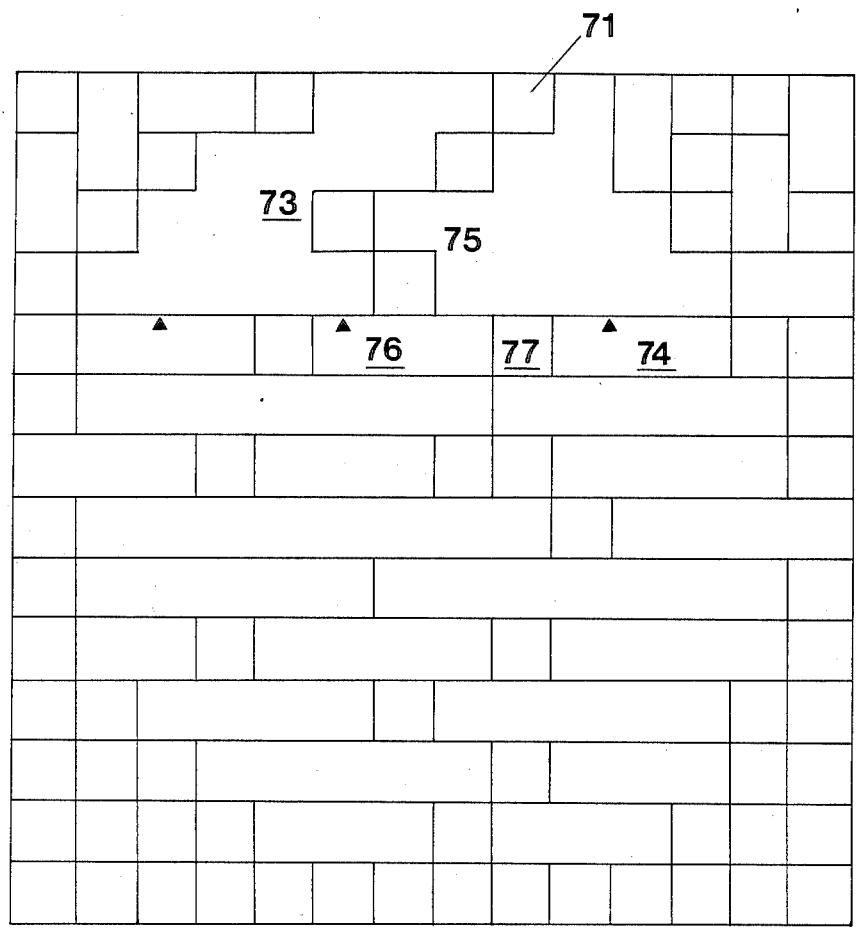

The connection along the 2nd dimension is illustrated by the drawings of FIGS. 6(a) and 6(b). Since whole sections are treated as units, only one connection point need be used. In order to find that point, the variation in the 2nd dimension overlap VarOV of the section is scanned for a minimum. The assumption is that if the "variation" in the overlap area of that subimage is minimal and under the threshold, then the data in that overlap area is not noise but rather it is real data which should retain continuity with no problems. This is depicted in FIG. 6(a) where each string of subimages, such as string 61, is divided into its sections, and for each section longer than 1 subimage an arrow, such as arrow 62, shows the (example) position of the connection point in the second dimension.

After the first section in the string is matched, the other sections in the string will match the preceding sections along the 2nd dimension modulo $2\pi$. That is, the difference between an overlapping pixel's phase value in a section and the lapped pixel's phase value in the preceding section in the second dimension (hereinafter called "above") must be a multiple of $2\pi$. Each section is then shifted up or down, as necessary, by the appropriate multiple of $2\pi$, until it matches the section "above" it.

This method of connecting whole sections at a time creates continuous zones in the image, which are two dimensional. This is shown in FIG. 6(b). In the noise part of the image (surrounding the object being imaged) these zones are small, maybe only one subimage large, such as zone 71. In the object part of the image, however, these zones are larger, such as zone 72. The difference in values between the zones in the zonal overlap areas are now multiples of $2\pi$ (and usually—exactly $2\pi$, up or down).

As more and more "strings" are connected, one zone tends to become dominant. This is because the sections are connected at only one point. Thus, if a section of one string, such as section 76, touches two section of a previous string (line) only one of those previous sections is continuously connected and the other may be blocked. In FIG. 6(b) section 76 touches sections 75 and zones 73 and 72; the selection of a connection point forces section 76 to be joined to zone 73. On the other hand, if two sections in the current string are connected to the same previous zone, then both become part of that zone although they were disconnected in the current string. This is the case with sections 74 and 76, which are both joined to zone 73. They now form a continuous zone although separated in the original string by section 77.

Figure 6C:
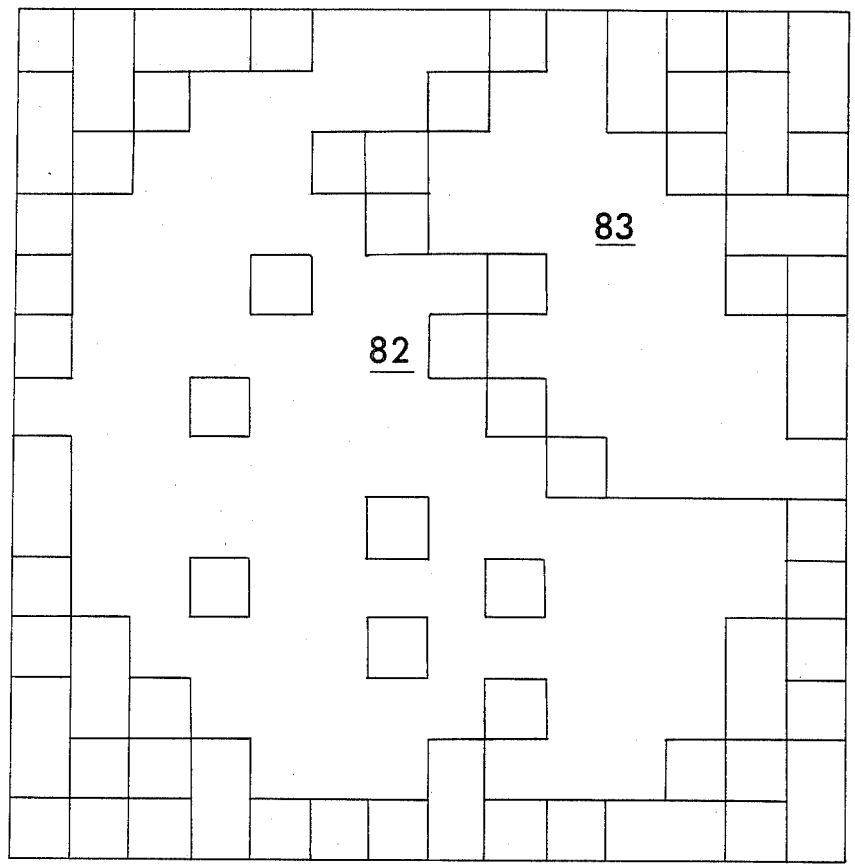

The current step ends as shown in FIG. 6(c), with a few large zones such as 82 and 83, covering most of the object part of the image. The noise part of the image is still covered with many small sections and subimages.

A 2nd Passage Over the Whole Image in the Opposite Direction

Figure 7A:
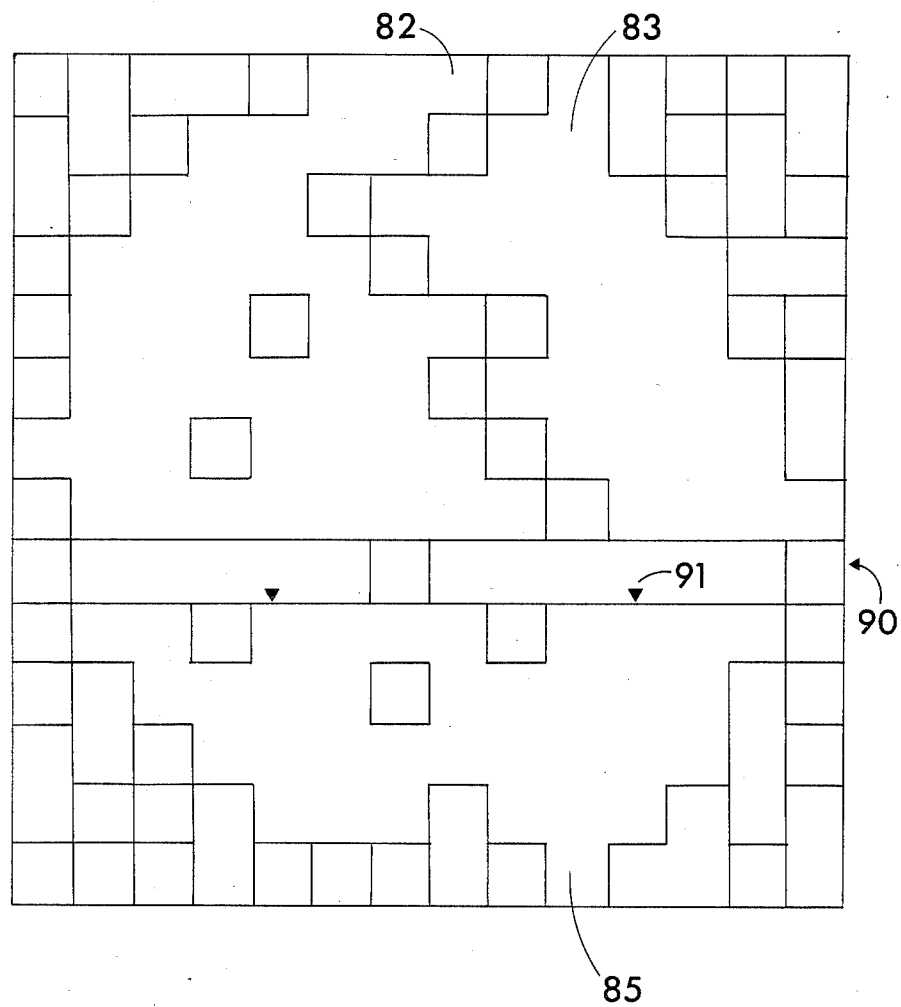
FIGS. 7(a) and 7(b) illustrate the connection of continuous sections and zones in an opposite direction.
Figure 7B:
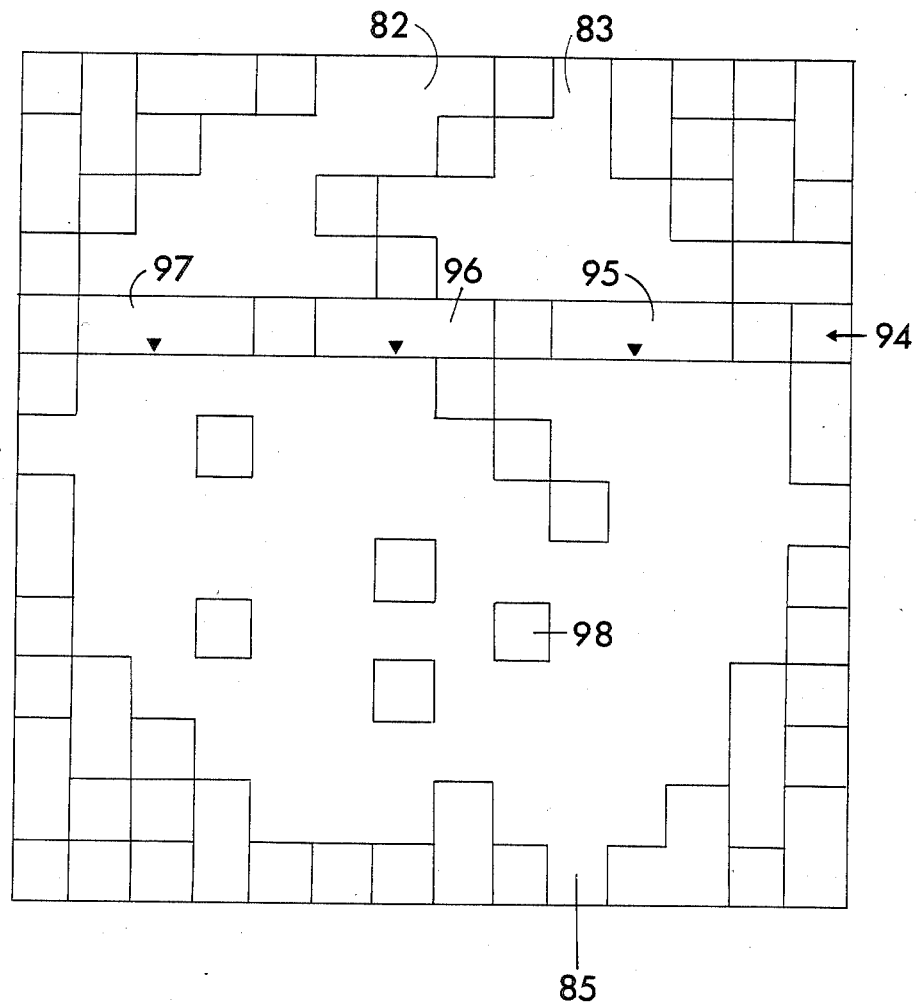

Repeating the whole procedure in the opposite direction further reduces the number of zones in the process of enlarging the zones. The section following the current section in the first scan, becomes the preceding section in the second scan. FIGS. 7(a) and 7(b) illustrate the beneficial effects of the scan in the opposite direction. In FIG. 7(a) the string 90 is being connected to zone 85 which is "below" it (in the same sense as the term "above" was used earlier). Arrow 91 indicates the direction of current connection. It is clear that all sections in string 90 which have a connection point which fulfills all the conditions will be joined to zone 85.

FIG. 7(b) depicts the situation when two separate zones 82 and 83, are seen "above" the current string 94. If the connection was being done "upward" the two zones would have remained isolated, but with the connection being done "downward" all three sections, 95,96 and 97 are joined to the same zone 85. Some noise zones may remain unconnected, but this is of no importance since those are areas with no appreciable signal.

There may remain isolated areas within the large final continuous zone, such as area 98 of FIG. 7(b), which are not connected because of high noise in their overlap areas. It is now possible to use the majority rule to "assign" area 98 phase values in all the overlaps with all (four, in our exemplary case) neighboring subimages. Assuming that all these neighboring subimages now belong to the same zone, this will be the best that can be done.

There may be cases where the terminator subimages join to make a continuous connection impossible using the above method, but these are cases which appear only rarely, if at all, in real life. The method outlined is based on the fact that the real inhomogeneity map is continuous and the method determines the continuity—it does not prove its continuity.

An Alternative Method

An alternative method to the up and down traverse of the image is as follows:
Connect along the string as described in the first method.
Make a first ("down") traverse connecting sections "up" to form zones or sections or as described in the first method.

Figure 8:
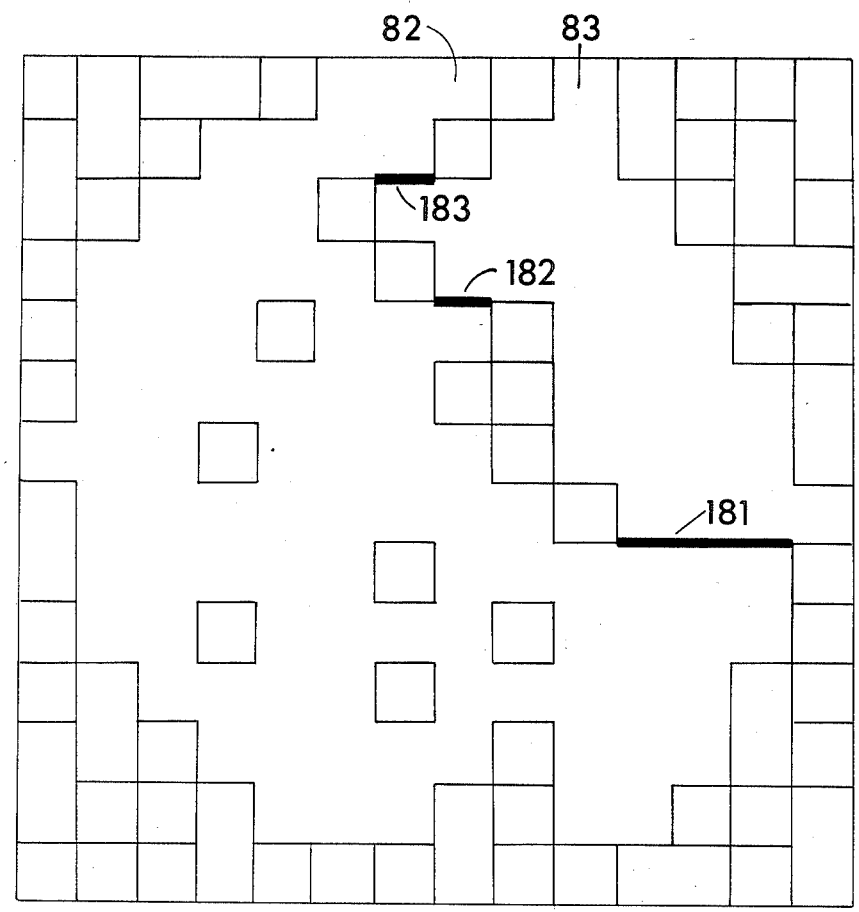
FIG. 8 illustrates an alternative connection of continuous zones.

During the first passage, mark all the subimages with a code or number indicating the zone to which they each belong. A second passage will not be a repeat of the first one in the opposite direction but will search and follow the border between different zones. This border will be treated as sections and the best connection subimage found. The zones will then be united. This is illustrated in FIG. 8, where the borders between zones 82 and zone 83 are marked by thicker lines.

A connectable section in this alternative method includes all subimages of a given zone which border upon subimages of a second given zone. Thus, sections 181, 182 and 183 all form one connectable section, i.e. the connection section between zones 82 and 83. It is among these overlap areas that the connection point is found and the joinder is made. The average "variation" in each overlap area i.e. sections 181–183 is calculated and the overlap area which has the lowest average "variation" in the connectable section is selected as the best connection point.

The zones are made continuous by adding the necessary multiple of $2\pi$ to all the subimage inside the zone with the higher, say, code or number (83 in FIG. 8) and changing the code or number of all the subimages in that zone to the codee or number of the unchanged zone. This in fact unites the two zones into a single one with the lower of the two codes or numbers. The process will end with a single zone covering the whole image. This alternative method will work even in the extreme cases, mentioned above, which resist the preferred method. This second method however, uses a different mechanism for the two passages and requires a complicated chore of finding all the borders between any two zones; and an irregularly shaped zone in which to shift the subimages and change their codes.

It should be noted that if a contiguous noisy area traverses the image from side to side it is possible that no method will cause the data regions on the two disconnected areas to be continuous with each other. However, in that case each separate data region should be treated as a separate image. Such cases are extremely rare, unless such images are acquired on purpose.

Figure 9:
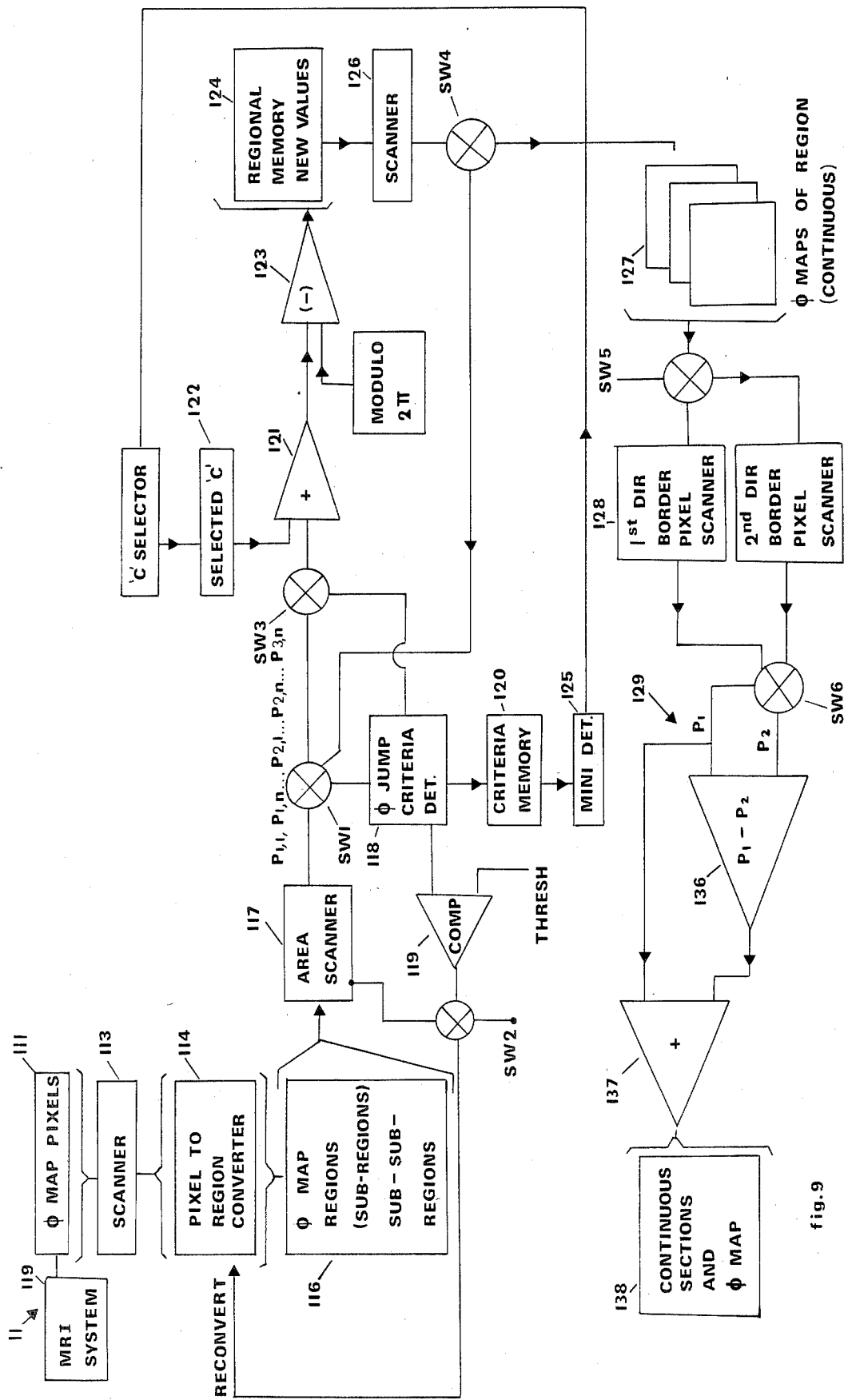
FIG. 9 shows in block diagram form an arrangemnt for carrying out the invention.

The general arrangement for providing continuous phase maps of this invention is shown by the system 11 of the block diagram of FIG. 9. The arrangement starts with the phase map arranged in rows and columns of elements corresponding to pixels as indicated at 111 in FIG 9. The phase map is provided by an MRI system indicated at 112. Examples of such MRI systems are well known to those skilled in the art.

The phase map is scanned by scanner 113. The phase can be said to "read out" by the scanner 113 to provide the pixel values to a pixel-to-region converter 114. The pixel-to-region converter divides the phase map into regions or subregions or sub subregions. Each region is comprised of a plurality of contigious pixels. The phase map 116, that is divived into the different areas, is then scanned by an area scanner to give out the values of the pixels in each such region.

The scanning of the regions or areas is accomplished on a sequential or selective basis. A first switch SW1 is located at the output of the area scanner 117 directs the pixel values as they are being read out to a phase jump criteria determination circuit 118 which determines whether there is a phase jump in the region in the manner described with regard to FIG. 1, for example. Thus the phase values of the elements in the area are 350, 340, 20, 345, 355, 359 etc. as shown in FIG. 1a. The phase differences and the sum of the differences are computed by the phase jump criteria determiner 118. The sum of the differences shown as 1,009 in FIG. 1b is then compared in a comparative circuit 119 which compares the summation of the differences to a threshold value (say 500, in the example of FIG. 1). If the sum of the differences is less than the threshold, then a signal is sent to the area scanner 117 through switch SW2 which tells the area scanner to start scanning the next area since the last area scanned is already continuous.

If the sum of the differences is more than the threshold value then the area scanner rescans the same area and sends the pixel values through switch SW3 to a summation circuit 121. The summation circuit adds a selected constant to each of the pixel values of the area. The selected constant is provided by selected C-circuit 122. The sum of the pixel value and the selected constant is then sent to a subtraction circuit 123 where the modulo $2\pi$ is subtracted from the output of the summation circuit 121. In a preferred embodiment the constants are increments of $2\pi/10$ (i.e. n $2\pi/10$) or 36°, 72°. The output of subtraction circuit 123 are the new elemental (PIXEL) values for the region being investigated which are stored in a regional memory 124.

The contents of the regional memory are sent to the phase jump criteria determining circuit 118 through a readout scanner 126 and switch SW4 and switch SW1. The output of the phase jump criteria determining circuit at this junction is transferred to the criteria memory 120. The jump criteria determining circuit sums the differences of the new pixel values of memory 124. In the example of FIG. 1 the sum is 154. The output of the criteria memory 120 is sent to a minimum detector which detects when the phase jump criteria determining circuit output is a minimum.

Ten different constants from 36° through 360° are used as the selected C. The minimum detector circuit 125 notes which constant provides the minimum and causes that constant to be selected to provide new values stored in the regional memory 124. The stored new values are read out by scanner 126 and sent through switch SW4 to form continuous phase maps of the regions shown at 127.

Means are provided for connecting the different continous regions to form one continuous phase map. In a preferred embodiment each of the elements (pixels) on the borders of the internally continuous regions are scanned in a first direction by scan circuit 128 through switch SW5. The output of circuit 128 is sent to border element matching circuitry 129 which adjusts phase values of selected elements to cause the element to match and hence causes the regions of the matching element form a continuous section (plurality of regions). The circuitry 129 determines the pulse differences between the overlapping (or abutting border) pixels as they are being scanned. This difference P1 − P2 is added to P1 whereby a selected pair of overlapping pixels to form a continous section in a first direction. Subsequently, the phase maps having continuous sections are scanned in the vertical direction to provide information to joining the sections together to form zones. Subsequently, after the first directional scans are completed, switch SW5 is operated to initiate a scan in second direction both horizontally and vertically. The outcome are continuous zones and a substantially continuous phase map.

Alernatively, after the continuous zones are formed, instead of doing a second direction border pixel scanning, the entire image is scanned to determine where the zones are contiguous to each other. Then, the contiguous section at the lowest value is used for joining the zones together by raising the pixel values in one of the zones to that of the other zone or changing the pixel values in each of the zones so that the overlapping pixel value between zones have the same value.

If after the second phase jump criteria determination, it is found that either there is a no minimum or that the minimum is too high, when the minimum is sent to comparative circuit 119 and compared to a threshold. Then a signal is sent through switch SW2 to pixel-to-region convertor 114 to cause the pixel to region converter to reconvert the phase map and cut regions to subregions.

An example of circuitry 127 is shown as including a subtraction circuit P1 − P2 which is designated number 136. The output of that circuit plus P1 value is sent to a summation circuit 137 and the final continous phase map shown at 138.

While the invention has been described using a broad aspect as an example, it should be understood that this example is not to be treated as limiting the scope of the invention which is defined by the accompanying claims.

What is claimed is:

1. A method of providing a continuous magnetic field map for magnetic resonance systems, said method including the steps of:
   acquiring a phase image comprising a plurality of elements corresponding to pixels,
   dividing the phase image into a plurality of subimages each comprising a plurality of said elements wherein the sizes of the subimages are sufficiently small to limit the phase spread of each of the subimages to being no more than $2\pi$, and
   phase unwrapping in each subimage by adding a selected modulo $2\pi$ constant to each element of the subimage to provide said continuous map of the magnetic field.

2. The method of claim 1 including the step of connecting two unwrapped subimages to form a section.

3. The method of claim 2 including the step of joining two sections to form zones.

4. The method of claim 3 including the step of connecting two or more zones together to form a substantially continuous image.

5. The method of claim 4 wherein the step of connecting together continuous subimages includes the step of connecting the subimages in a first direction along an orthogonal axis of orthogonal axes.

6. The method of claim 5 wherein the step of connecting two or more sections together comprises connecting the sections together in a second direction along another of said orthogonal axes.

7. The method of claim 6 including reversing the first direction and the second direction.

8. The method of claim 7 wherein the step of joining the zones together comprises determining at which of said elements the zones are juxtaposed and joining the zones together at the juxtaposed elements having the least phase value.

9. A system for providing a continous magnetic field map for magnetic resonance systems, said system including:
- means for acquiring a phase image comprising a plurality of elements corresponding to pixels,
- means for dividing the phase image into a plurality of subimages each comprising a plurality of said elements wherein the sizes of the subimages are sufficiently small to limit the phase spread of each of the subimages to being no more than $2\pi$, and
- means for phase unwrapping each subimage by adding a selected modulo $2\pi$ constant to each element of the subimage to provide said continuous map of the magnetic field.

10. The system of claim 9 including: means for connecting two unwrapped subimages to form a section.

11. The system of claim 10 including means for joining two sections to form zones.

12. The system of claim 11 including the step of connecting two or more zones together to form a substantially continuous image.

13. The system of claim 12 wherein the means for connecting together continuous subimages includes means for connecting the subimages in a first direction along an orthogonal axis of orthogonal axes.

14. The system of claim 13 wherein the means for connecting two or more sections together comprises means for connecting the sections together in a second direction along another of said orthogonal axes.

15. The system of claim 14 including means for reversing in the first direction and the second direction.

16. The system of claim 15 wherein said means for joining the zones together comprises means for determining at which of said elements the zones are juxtaposed and joining the zones together at the juxtaposed elements having the least phase value.

* * * * *